United States Patent [19]

Abrokwah et al.

[11] Patent Number: 5,060,031
[45] Date of Patent: Oct. 22, 1991

[54] COMPLEMENTARY HETEROJUNCTION FIELD EFFECT TRANSISTOR WITH AN ANISOTYPE N+ GATE FOR P-CHANNEL DEVICES

[75] Inventors: Jonathan K. Abrokwah, Tempe; Schyi-Yi Wu, Mesa; Jenn-Hwa Huang, Gilbert, all of Ariz.

[73] Assignee: Motorola, Inc, Schaumburg, Ill.

[21] Appl. No.: 584,014

[22] Filed: Sep. 18, 1990

[51] Int. Cl.$^5$ ............................................. H01L 29/80
[52] U.S. Cl. .......................................... 357/22; 357/16
[58] Field of Search ................. 357/22 A, 22 MD, 22, 357/16

[56] References Cited

U.S. PATENT DOCUMENTS

| | | | |
|---|---|---|---|
| 4,471,366 | 9/1984 | Delagebeaudeuf et al. | 357/22 A |
| 4,652,896 | 3/1987 | Das et al. | 357/22 A |
| 4,729,000 | 3/1988 | Abrokwah | 357/22 |
| 4,771,324 | 9/1988 | Odani et al. | 357/22 A |
| 4,814,851 | 3/1989 | Abrokwah et al. | 357/22 A |
| 4,862,228 | 8/1989 | Ralph | 357/22 A |
| 4,899,201 | 2/1990 | Xu et al. | 357/22 A |

FOREIGN PATENT DOCUMENTS

| | | | |
|---|---|---|---|
| A0250886 | 1/1988 | European Pat. Off. | 357/22 A |
| A0283878 | 9/1988 | European Pat. Off. | 357/22 A |
| 61-49479 | 3/1986 | Japan | 357/22 A |
| 61-99379 | 5/1986 | Japan | 357/22 MD |
| 62-136080 | 6/1987 | Japan | 357/22 A |
| 63-181479 | 7/1988 | Japan | 357/22 A |

OTHER PUBLICATIONS

IEEE Electron Device Letters, vol. 11. No. 1, Jan. 1990, "An Anisotype GaAs/InxGa1−xAs Heterojunction Field-Effect Transistor Digital Logic Applications", by Lin et al., 30-31.

IEEE Transactions on Electron Devices, vol. 37, No. 6, Jun. 1990, "High-Performance Self-Aligned p+/n GaAs Epitaxial JFET's Incorporating AlGaAs Etch-Stop Layer", by Abrokwah et al., pp. 1529-1531.

IEEE Transactions on Electron Devices, vol. 37, No. 8, Aug. 1990, "π-Heterostructure Field Effect Transistors for VLSI Applications " by Lee et al., pp. 1810-1820.

IEEE Transactions on Electron Devices, vol. 36, No. 11, Nov. 1989, "Quantum-Well p-Channel AlGaAs/InGaAs/GaAs Heterostructure Insulated-Gate Field-Effect Transistors " by Ruden et al., pp. 2371-2379.

Primary Examiner—Rolf Hille
Assistant Examiner—Steven Loke
Attorney, Agent, or Firm—Stuart T. Langley

[57] ABSTRACT

A GaAs complementary HFET structure having an anisotype layer formed underneath the P-channel device gate is provided. The anisotype layer is heavily doped N-type and is formed in contact with a semi-insulating AlGaAs barrier of the P-channel FET. A pre-ohmic layer is formed over the anisotype layer and a gate electrode is formed over the pre-ohmic layer. In a first embodiment, the pre-ohmic layer comprises undoped gallium arsenide amd the gate electrode forms a Schottky diode with the pre-ohmic layer. The anisotype layer forms a semiconductor junction with the semi-insulating AlGaAs barrier wherein the semiconductor junction replaces or augments a conventional Schottky junction. In a second embodiment, the pre-ohmic layer comprises heavily doped InGaAs and the gate electrode forms an ohmic contact to the doped InGaAs. The semiconductor junction at the P-channel device gate results in higher built in potential barrier and improved P-channel gate turn on voltage.

12 Claims, 1 Drawing Sheet

COMPLEMENTARY HETEROJUNCTION FIELD EFFECT TRANSISTOR WITH AN ANISOTYPE N+ GATE FOR P-CHANNEL DEVICES

BACKGROUND OF THE INVENTION

The present invention relates, in general, to gallium arsenide based transistors, and more particularly, to Complementary Heterojunction Field Effect Transistors (CHFETs) having an anisotype $N^+$ gate for P-channel devices.

Gallium arsenide based semiconductor complementary heterostructure devices have been predicted to offer significant speed and power advantage over silicon complementary devices, such as CMOS, under ideal conditions of insignificant leakage currents. A key to high speed, low power performance lies in realization of N-channel and P-channel FET devices having acceptable threshold voltages and low gate leakages and subthreshold currents. Several heterostructures have been reported in recent years which attempt to address these requirements. The speed/power performance of most devices is limited largely by gate leakage. Unlike silicon dioxide insulators of silicon based CMOS devices, the insulator layer in gallium arsenide HFET's, undoped aluminum gallium arsenide (AlGaAs) is not a true insulator, but is instead a semi-insulator with comparatively high leakage.

Of the CMOS like devices which can be realized using III-V materials, the simplest are the N and P-channel heterostructure insulated gate FETs (HIGFETs). These devices use a two-dimensional electron gas or hole gas for the N-channel and P-channel device, respectively for high mobility. In such HFETs with intentionally undoped structures, threshold voltages are essentially the difference in the metal semiconductor Schottky barriers and the conduction band or valence band discontinuities for the N-channel and P-channel devices, respectively. These threshold voltages are unfortunately not optimum for direct coupled FET logic applications. Threshold voltages are about 0.8 volt for N-channel and −0.7 volt for P-channel devices in such a structure. Since, in general, the gate turn on voltage occurs at gate voltages of 1.1 to 1.2 volts, these devices are limited in their voltage swing and hence speed/power performance.

Absolute value of threshold voltage can be adjusted to an appropriate range of 0.2 to 0.4 volts by using dopend channel or inverted pulse doped structures. For the N-channel device $N^+$ indium gallium arsenide (InGaAs) or germanium gates have also been recently used to change barrier height of the N-channel device. This approach has been successfully applied to reduce threshold voltage of the N-channel HFET to the desirable range for direct coupled FET logic (DCFL) circuits. Threshold voltage of an N-channel HFET with an $N^+$ InGaAs cap layer in the gate is the difference between InGaAs and GaAs work functions. Thus, the threshold voltage is set by the composition of the InGaAs cap. Even though the threshold voltage is reduced to appropriate range, improvement in gate leakage is needed. This requires enhancing barrier heights which control leakage.

One technique that has been used in the past in conjunction with N-channel field effect transistors is the use of an anisotype layer underneath the gate electrode, also called the gate metal. The anisotype layer either replaces or augments an existing Schottky junction between the gate conductor and the AlGaAs semi-insulating region which separates the gate conductor from the channel region. The effect of the anisotype layer is to increase the work function at the surface. Due to higher built-in potential, the gate turn-on voltage can be increased above that of a conventional N-channel FET. Similar principles, for example Shannon contacts, have been applied to silicon solar cell structures. Until now, however, this approach has not been applied to P-channel or complementary HIGFET structures.

Accordingly, it is an object of the present invention to provide a P-channel compound semiconductor based field effect transistor having lower gate leakage.

A further object of the present invention is to provide a complementary heterostructure field effect transistor structure having improved speed/power characteristics.

Still a further object of the present invention is to provide a complementary gallium arsenide based field effect transistor having improved P-channel device characteristics.

SUMMARY OF THE INVENTION

These and other objects and advantages of the present invention are achieved by providing a complementary HFET structure having an anisotype layer formed underneath a gate electrode or gate metal of a P-channel device. The anisotype layer is heavily doped N-type and is formed in contact with an aluminum gallium arsenide (AlGaAs) semi-insulating region of the P-channel FET. Doping and thickness of the anisotype layer are chosen so that the layer is undepleted in operation. An intermediate layer is included between the anisotype layer and the gate electrode or metal. In a first embodiment, the anisotype layer comprises gallium arsenide and the intermediate layer comprises a thin layer of undoped gallium arsenide (GaAs). The gate electrode forms a Schottky diode with the undoped GaAs.

In a second embodiment, the gate metal forms an ohmic contact to the intermediate layer. The intermediate layer comprises N-type InGaAs which is compositionally graded from substantially gallium arsenide at the interface with the anisotype layer to $In_xGa_{1-x}As$, where x is greater than or equal to 0.5. The intermediate layer improves ohmic contact between the gate metal and the anisotype layer.

In the first embodiment, the gate electrode forms a rectifying contact with the undoped GaAs layer and the rectifying contact augments a semiconductor junction formed by a delta-doped anisotype layer and the semi-insulating region of the P-channel FET. In the second embodiment, the gate electrode forms an ohmic contact with the pre-ohmic layer and therefore gate characteristics are determined completely by the semiconductor junction formed by the anisotype layer and the semi-insulating layer of the HFET. The substitution of a semiconductor junction for a conventional Schottky junction in the gate of the P-channel HFET results in higher built in potentials thus lower gate leakage.

DETAILED DESCRIPTION OF THE DRAWINGS

Figure 1:
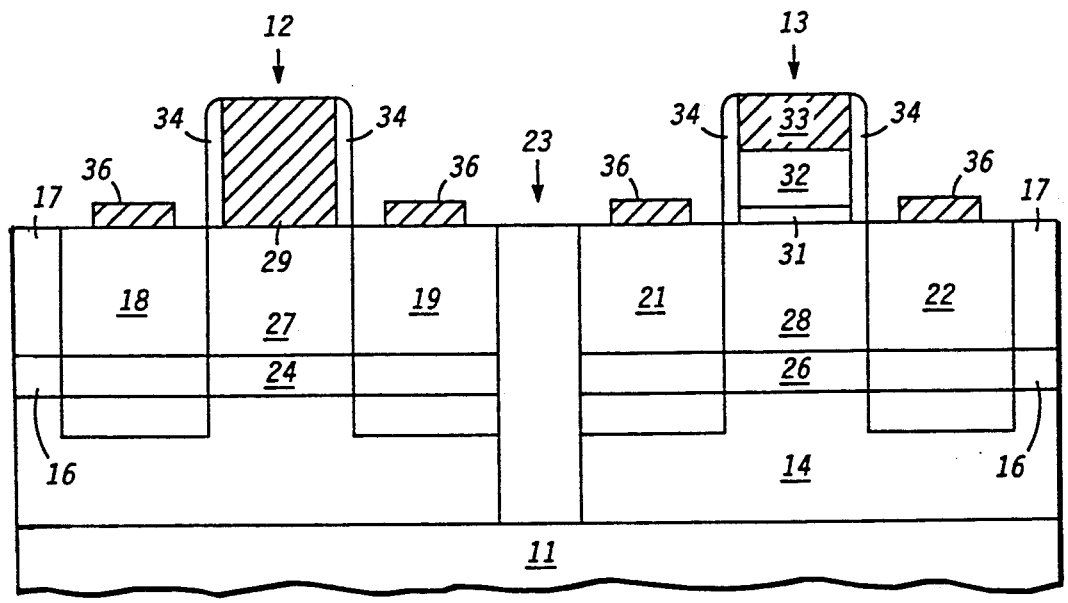
FIG. 1 illustrates a highly simplified cross-sectional view of a basic HFET structure of an embodiment of the present invention.

FIG. 1 illustrates a highly simplified cross-sectional view of a basic HFET structure embodying the anisotype gate of the present invention. It should be understood that the basic structure illustrated in FIG. 1 is extremely simplified for ease of understanding, as is evident when the structure of FIG. 1 is compared to a more practical structure of FIG. 2. The structure shown in FIG. 1, however, illustrates the basic principles of the present invention.

Complementary HFET structures have suffered from low speed/power performance primarily due to gate leakage in the P-channel device. In general, the P-channel devices have performed more poorly than N-channel devices due to lower hole mobility and higher gate leakage. Threshold voltage is non-ideal for both N-channel and P-channel devices; structures for improved N-channel threshold are known, however. Although illustrated in terms of a complementary HFET structure, it should be understood that the anisotype gate of the present invention would also be effective in a modulation doped complemenatary field effect transistor, or MODFET. MODFET structures are well known and it would be relatively simple for one of ordinary skill in the art to substitute the anisotype gate structure of the present invention into a conventional MODFET design. Also, the structure of the present invention would be useful in a P-channel only circuit.

Referring now to FIG. 1, semi-insulating substrate 11 is provided comprising a material such as gallium arsenide (GaAs). Epitaxial buffer layer 14 comprising substantially intrinsic GaAs is formed covering semi-insulating substrate 11. the term "epitaxially grown" is intended to include all commonly used epitaxy processes such as molecular beam epitaxy (MBE), metal-organic chemical vapor deposition (MOCVD), atomic layer epitaxy (ALE), and the like.

Semi-insulating gallium arsenide buffer layer 14 is covered with an epitaxially grown channel layer 16 which preferably comprises indium gallaium arsenide (InGaAs). Specifically, $In_{0.15}Ga_{0.85}As$ of approximately fifteen nanometers thick is a useful composition and thickness for a channel layer 16. Channel layer 16 is covered with an epitaxially grown substantially intrinsic layer 17 of aluminum gallium arsenide ($Al_x$-$Ga_{1-x}As$). Channel layer 16 and semi-insulating layer 17 will form channel regions 24 and 26 and semi-insulating regions 27 and 28, respectively, of both N-channel HFET 12 and P-channel HFET 13. the anisotype gate structure of the present invention is also applicable to HFET structures which use undoped GaAs as the channel.

Referring to P-channel FET 13, anisotype layer 31 is epitaxially formed over at least a portion of semi-insulating layer 17 and in contact with semi-insulating layer 17 over channel region 26 of P-channel FET 13. Anisotype layer 31 is designed so that the layer is undepleted in operation. An example of a suitable anisotype layer 31 would be an N+ GaAs layer 200 to 500 angstroms thick with a doping concentration of approximately $5 \times 10^{18}$ atoms/cm$^3$. Anisotype layer 31 can also be extremely thin and highly doped; it is then referred to as a delta-doped layer or a multiple delta-doped layer when more than one extremely thin highly doped layer is used. Doping concentration and delta doping spacing can be adjusted to vary barrier height as needed. Anisotype layer 31 forms a semiconductor junction with a portion 28 of semi-insulating layer 17 which lies over channel region 26 of P-channel FET 13. A pre-ohmic layer 32 is formed covering anisotype layer 31 and a P-channel FET gate electrode 33 is formed on the pre-ohmic layer 32. Composition of pre-ohmic layer 32 will be discussed in more detail hereinafter.

Typically, sidewall spacers 34 are formed along sides of gate structure comprising layers 31, 32, and 33. Sidewall spacers 34 comprise a dielectric material and function to separate the gate from other structures in the device. Source region 21 and drain region 22 are formed simultaneously by a P-type implant using the gate structure as a mask. Source 21 and drain 22 should extend below channel layer 16 into buffer layer 14 to ensure low resistance source and drain contacts to channel region 26.

Referring now to N-channel FET 12, a gate electrode is preferably formed directly in contact with semi-insulating layer 27. This gate structure is commonly formed with materials such as tungsten nitride used for N-channel FET electrode 29. Tungsten nitride will form a Schottky contact with semi-insulating region 27 of N-channel FET 12. Like P-channel FET 13, dielectric sidewall spacers 34 are formed alongside of gate electrode 29 and the gate structure is used as a mask during an N-implant used to form source 18 and drain 19 of N-channel FET 12.

In both N-channel FET 12 and P-channel FET 13 source electrodes and drain electrodes 36 are formed in contact with source and drain regions, respectively. As shown in FIG. 1, source and drain electrodes 36 are formed in direct contact with semi-insulating layer 17 which, even though it is doped heavily to form source and drain regions, requires that electrodes 36 be alloyed electrodes. Processes for formign alloyed electrodes are well known in the semiconductor industry.

Isolating region 23 can be formed by a process such as oxygen implant and is used ot separate N-channel FET 12 and P-channel FET 13 electrically.

In operation, a positive voltage applied to N-channel gate electrode 29 induces a two dimentional (2D) electron gas to form in channel region 24, particularly at the interface of channel region 24 and semi-insulating region 27. The 2D electron gas couples source 18 and drain 19. Threshold voltage of N-channel FET 12 can be adjusted by ion implanting impurities into semi-insulating region 27 and channel region 27. For example, silicon can be implanted to lower threshold voltage.

P-channel FET 13 operates in an analogous fashion to N-channel FET 12. When a negative voltage is applied to gate electrode 33, the voltage is coupled through pre-ohmic layer 32 to anisotype layer 31. In a first embodiment, pre-ohmic layer 32 comprises substantially intrinsic GaAs and so gate electrode 33 may form a rectifyign contact with pre-ohmic layer 32. In another embodiment pre-ohmic layer 32 comprises a compositionally graded InGaAs layer which varies from a high GaAs concentration at the interface between anisotype layer 31 and pre-ohmic layer 32 to a primarily InGaAs composition at the interface between pre-ohmic layer 32 and gate electrode 33. This second embodiment ensures that the contact between gate electrode 33 and pre-ohmic layer 32 is low resistance ohmic.

Either embodiment relies primarily on a semiconductor N+-I-P junction formed between anisotype layer 31 and semi-insulating region 28, and P-channel 26, with semi-insulating region 28 as a peimary gate barrier. This is in contrast with a convention al HFET which relies on a Schottky barrier for both N and P-channel devices. By replacing the Schottky barrier with a semiconductor junction in P-channel FET 13, a higher barrier voltage, nearly 1.7 volts, is achieved resulting in lower gate leakage. In operation, a negative voltage applied to gate electrode 33 results in a 2D hole gas formed in channel region 26 which couples source 21 and drain 22.

Figure 2:
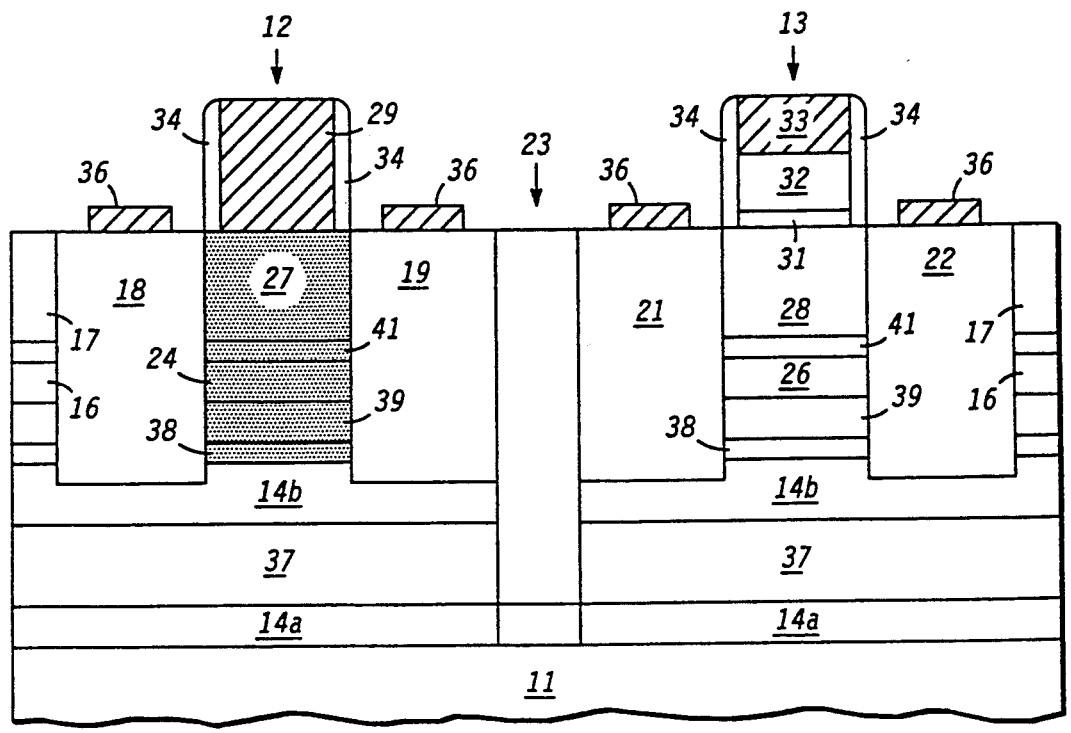
FIG. 2 illustrates a more detailed cross-section illustrating a preferred embodiment HFET structure having the anisotype gate structure of the present invention.

FIG. 2 illustrates a somewhat more detailed HFET structure similar to that shown in FIG. 1. The structure shown in FIG. 2 contains additional features which improve performance of the HFET and would usually be used in a practical device. Those elements of the HFET structure which were shown in FIG. 1 are labeled with the same reference numbers in FIG. 2 where possible.

A notable difference in the structure shown in FIG. 2 is that a substantially intrinsic AlGaAs buffer layer 37 is inserted into the middle of intrinsic GaAs buffer 14. GaAs buffer 14 is indicated in FIG. 2 by a lower region 14a and an upper region 14b which are separated by AlGaAs buffer layer 37. On top of GaAs buffer layer 14b is a pulse doping layer 38 comprising P-type GaAs. Pulse doping layer 38 is covered with an undoped GaAs spacer layer 39 which separates pulse doped layer 38 from channel layer 16. Pulse doped layer 38 provides holes which tunnel through spacer layer 39 into channel region 36 of P-channel FET 13. Thus, pulse doped layer 38 modulation dopes channel 36 of P-channel FET 13. Since pulsed dopen layer 38 is epitaxially formed, it will extend through N-channel FET 12. It serves no function in the performance of N-channel FET 12, and is illustrated only to more accurately depict a realistic device structure.

Channel layer 16 is covered by an intrinsic aluminum arsenide (AlAs) layer 41 which serves to confine carriers in channel 24 and 26 and further reduces gate leakage. AlGaAs buffer layer 37 reduces sub-threshold current and charge carrier conduction between channel regions 24 and 26 and substrate 11. Teh remaining portions of FIG. 2 are similar to and function in a similar manner to those described in FIG. 1.

One other change which could be made which could aid in manufacturing a complementary HFET device would be to allow anisotype layer 31 and pre-ohmic layer 32 to extend over source and drain regions 18, 19, 21, and 22. This is particularly useful when pre-ohmic region 32 comprises compositionally graded InGaAs layer. Since these layers are already provided in the structure, no additional processing is required to include them over source and drain regions. Inclusion of this layer allows non-alloyed contacts to be used for source and drain contacts 36, since non-alloyed contacts can be readily made to graded InGaAs pre-ohmic layer 32. One difficulty that may arise, particularly with P-channel FET 13, is that source region 21 and drain region 22 must be heavily doped so N-type anisotype layer 31 is converted to P-type. The choise of whether to use alloyed contacts or non-alloyed contacts for source and drain electrodes 36 is a design choise which should be based on available processes and yield considerations.

Anisotype layer 31, in combination with pulse dopgin layer 38, provides a threshold voltage of about −0.2 volts for P-channel FET 13, while increasing gate turn-on voltage to nearly 1.7 volts. Thus the separation between gate turn-on and gate threshold is greatly improved over prior art devices where only a Schottky barrier is used. By using ion implantation to adjust the threshold of N-channel FET 24, indicated by shaded portions in FIG. 2, compatible N and P-channel FETs can be manufactured on a common substrate using substantially similar processes. Lower threshold voltage and higher gate turn-on voltage increase the speed/power product of the complementary device.

We claim:

1. A complementary GaAs based heterostructure integrated circuit structure comprising: a semi-insulating GaAs substrate having a major surface; a first epitaxial layer of substantially intrinsic GaAs grown directly over the major surface; a second epitaxially grown layer of substantially intrinsic AlGaAs grown directly over the first layer; a third epitaxially grown layer of substantially intrinsic GaAs grown over the second layer; a fourth epitaxial layer of substantially intrinsic InGaAs grown over the third layer; a fifth epitaxial layer of substantially intrinsic AlAs grown over the fourth layer; a sixth layer of substantially intrinsic AlGaAs grown over the fifth layer; first and second N-type regions formed in the surface of the sixth layer and extending to the third layer, wherein a portion of the fourth layer which lies between the first and second N-type regions forms a channel of an N-channel HFET; a conductive material formed on top of the sixth layer between and separated from the first and second N-type regions and making a rectifying contact with the sixth layer, wherein the conductive material serves as a gate electrode of the N-channel HFET; electrodes formed on the first and second N-type regions to serve as source-drain electrodes of the N-channel HFET; first and second P-type regions formed in the surface of the sixth layer and extending to the third layer, wherein a portion of the fourth layer which lies between the first and second P-type regions forms a channel of a P-channel HFET; an epitaxially grown N-type anisotype region covering a portion of the sixth layer between and separated from the first and second P-type regions; an epitaxially grown pre-ohmic layer covering the N-type anisotype region; a conductive material formed on top of the pre-ohmic layer making contact with the pre-ohmic layer, wherein the conductive material serves as a gate electrode of the P-channel HFET; electrodes formed on the first and second P-type regions to serve as source-drain electrodes of the P-channel HFET; and an insulating region formed between the N-channel and the P-channel HFET.

2. The integrated circuit of claim 1 wherein the pre-ohmic layer comprises an epitaxially grown layer of substantially intrinsic GaAs, and the contact between the gate electrode and the pre-ohmic layer is a rectifying contact.

3. The integrated circuit of claim 1 wherein the pre-ohmic layer comprises an epitaxially grown layer of N-type InGaAs which is graded in composition from GaAs at an interface with the anisotype region to a composition of $In_xGa_{1-x}As$ at an interface with the gate electrode, where x is greater than or equal to 0.5.

4. The integrated circuit of claim 1 wherein the epitaxially grown N-type anisotype region has a thickness in the range of 200 to 500 angstroms and a substantially uniform doping concentration of at least $5 \times 10^{18}$ atoms/cm$^3$.

5. A complementary HFET structure having N-channel and P-channel HFET devices, the improvement comprising: at least a single delta-doped N-type anisotype layer formed under a gate electrode of the P-channel HFET device; a pre-ohmic layer formed between the N-type anisotype layer and the gate electrode, wherein the gate electrode makes an electrical contact to the pre-ohmic layer.

6. The HFET of claim 5 wherein the pre-ohmic layer comprises an epitaxially grown layer of substantially intrinsic GaAs and the electrical contact from the gate electrode to the pre-ohmic layer is rectifying.

7. The HFET of claim 5 wherein the pre-ohmic layer comprises an epitaxially grown layer of N-type InGaAs which is graded in composition from GaAs at an interface with the N-type anisotype layer to a composition of $In_xGa_{1-x}As$ at an interface with the gate electrode, where x is greater than or equal to 0.5 and the electrical contact to the pre-ohmic layer is substantially ohmic.

8. The HFET of claim 5 wherein threshold voltage of the N-channel device is controlled by N-type dopant which is implanted into a channel and a semi-insulating region of the N-channel device.

9. The HFET of claim 5 wherein the N-channel and P-channel devices are separated by an isolation region comprising an oxygen implanted semiconductor region.

10. A complementary GaAs heterostructure field effect transistor structure comprising: an N-channel field effect transistor having gate, drain, and source electrodes; a P-channel field effect transistor having gate, drain, and source electrodes; an intrinsic channel region located underneath the gate electrode; a barrier region located between the channel region and the gate electrode; an n-type delta-doped region formed on the barrier region; and an intermediate layer of material coupling the gate electrode of the P-channel device to the n-type delta-doped region, wherein the material for coupling has a bandgap no greater than a bandgap of the delta-doped region.

11. The complementary field effect transistor structure of claim 10 wherein the barrier region comprises a layer of intrinsic AlGaAs between the channel region and the N-type delta-doped region.

12. A P-channel HFET having a gate electrode, a source electrode, a drain electrode, a channel region, and a semi-insulating region formed between the gate electrode and the channel region, the improvement comprising: an N-type region formed underneath the gate electrode and in contact with the semi-insulating region so as to make a rectifying coupling between the gate electrode and the semi-insulating region; and a means for preventing depletion of the N-type region formed between the N-type region and the gate electrode.

* * * * *